(12) United States Patent
Takiguchi

(10) Patent No.: US 6,191,843 B1
(45) Date of Patent: Feb. 20, 2001

(54) EXPOSURE DEVICE, METHOD OF MAKING AND USING SAME, AND OBJECTS EXPOSED BY THE EXPOSURE DEVICE

(75) Inventor: Masao Takiguchi, Kawasaki (JP)

(73) Assignee: Nikon Corporation, Tokyo (JP)

( * ) Notice: Under 35 U.S.C. 154(b), the term of this patent shall be extended for 0 days.

(21) Appl. No.: 09/389,083

(22) Filed: Sep. 2, 1999

(30) Foreign Application Priority Data

Sep. 9, 1998 (JP) .................................................. 10-255780

(51) Int. Cl.[7] .......................... G03B 27/52; G03B 27/42; G02B 21/36; G01B 11/00; G03G 15/00
(52) U.S. Cl. .................................. 355/30; 355/53; 355/67; 355/77; 359/362; 356/399; 399/4; 399/32; 399/51
(58) Field of Search ..................... 355/53, 67, 77, 355/30; 359/362; 356/399; 399/4, 32, 51

(56) References Cited

U.S. PATENT DOCUMENTS

| 5,425,045 | * | 6/1995 | Hamatani ............................. 372/101 |
|---|---|---|---|
| 5,559,584 | | 9/1996 | Miyaji et al. . |
| 5,696,623 | * | 12/1997 | Fujie et al. ............................. 355/30 |
| 5,715,037 | | 2/1998 | Saiki et al. . |
| 5,812,242 | * | 9/1998 | Tokuda .................................... 355/30 |
| 5,883,704 | * | 3/1999 | Nishi et al. ............................. 355/67 |
| 5,892,572 | * | 4/1999 | Nishi ....................................... 355/67 |
| 5,906,429 | | 5/1999 | Mori et al. . |
| 5,995,263 | * | 11/1999 | Tokuda et al. ....................... 359/196 |

* cited by examiner

Primary Examiner—Russell Adams
Assistant Examiner—Khaled Brown
(74) Attorney, Agent, or Firm—Oliff & Berridge, PLC

(57) ABSTRACT

Even when a surface temperature of an illumination optical system becomes high, detection accuracy of a reticle alignment detection system is not negatively affected. An illumination optical system irradiates an illumination light to a mask and exposes a substrate with the illumination light through the mask. A gas supply device supplies gas, which has been cleaned, to a case in which is disposed at least part of an illumination optical system. A temperature adjusting device adjusts the temperature of the case and the temperature in the vicinity of the case.

40 Claims, 5 Drawing Sheets

EXPOSURE DEVICE, METHOD OF MAKING AND USING SAME, AND OBJECTS EXPOSED BY THE EXPOSURE DEVICE

BACKGROUND OF THE INVENTION

1. Field of Invention

This invention relates to an exposure device that illuminates a mask with illumination light that is irradiated from an illumination optical system and exposes a pattern formed in a mask onto a substrate, and in particular, to a preferred exposure device in which at least part of an illumination optical system is disposed within a case.

2. Description of Related Art

FIG. 5 shows an example of one type of exposure device. The exposure device 1 shown in this figure provides an exposure device main body 3 and a temperature adjusting device 4 within a chamber 2. The exposure device main body 3 mainly includes an illumination optical system 5, a reticle stage 6 that holds a reticle (mask) R, a projection optical system 7, and a substrate stage 8 that holds a substrate P and is housed in a temperature adjusting chamber 11, which is located within the chamber 2.

The illumination optical system 5 shown in FIG. 6 selects a necessary wave length from a light beam generated from a light source 9 and illuminates the reticle R that is held on the reticle stage 6 with exposure light in which illumination is evenly distributed (made uniform).

The projection optical system 7 projects an image of a pattern PA of the reticle R illuminated with the exposure light onto the substrate P that is held on the substrate stage 8. A reticle alignment detection system 10 is disposed between the illumination optical system 5 and the reticle stage 6. The reticle alignment detection system 10 detects a reference mark FM disposed on the substrate stage 8 through the projection optical system 7 and detects an alignment reticle mark RM formed on the reticle R. By calculating the shift between the reticle R and the substrate stage 8 based upon the detection results, positioning between the reticle R and the substrate stage 8 is performed.

The temperature adjusting device 4 adjusts the temperature of air within the temperature adjusting chamber 11 which is taken in from a return duct 12 and air that is taken in from an external air intake 13, to a predetermined temperature, and sends temperature-adjusted air through jets (inlets) 15 of a partition wall 14 into the temperature adjusting chamber 11. A filter (not depicted) to remove dust in the air is disposed over the jets 15. The air in the temperature adjusting chamber 11 is temperature-adjusted by the temperature adjusting device 4, and thereby maintains an environment having a constant temperature and cleanliness in which dust is removed, by the filter.

Recently, there has been observed a phenomenon in which particles become attached to a surface of a glass component, for example, an optical element within the illumination optical system 5. This drastically decreases the illumination when the pattern PA of the reticle R is projected onto the substrate P. This phenomenon occurs because, for example, when an ArF excimer laser is used as a light source 9, its emission spectrum overlaps an oxygen absorption spectrum area, causing ammonium sulfate to be generated as the light usage efficiency due to oxygen absorption decreases. Chemical components included in the air within the temperature adjusting chamber 11 undergo a photochemical reaction by ultraviolet light (particularly light and the like of the wavelength shorter than the i beam) generated from the light source 9 within the illumination optical system 5. The product of this photochemical reaction (the above-referenced particles) become attached to the glass components.

As a strategy to combat this problem, a method called an $N_2$ purge is used in which the illumination optical system 5 is stored within a case, a degree of sealing of which is made to be high within the illumination optical system 5 except in the vicinity of the light source 9. The case is filled with a gas that is inert for the photochemical reaction and has a small amount of light absorption, such as $N_2$ gas. This makes it difficult for the photochemical reaction to occur. By using this method, an impurity such as ammonium sulfate attached to glass components within the illumination optical system 5 was decreased, but an operation interval to remove such an impurity was made to be significantly long.

However, a conventional exposure device described above has the following problems. The illumination optical system 5 generates a large amount of heat because it has an optical path including the light source 9. Because of this, in a conventional illumination optical system 5, as shown in FIG. 6, an air intake 16 and a heat emission duct 17 are provided. Heat generated in the air from the illumination optical system 5 is emitted from the system 5 by taking in air through air intake 16 and emitting heat from heat emission duct 17. Thus, the surface temperature of the optical elements that form the illumination optical system 5 did not become too high.

However, because other optical elements excluding the light source 9 were separated by an $N_2$ purge in a state in which the degree of sealing was made to be high, heat emission from the sealed part was inhibited, the heat was confined in the $N_2$ purge area, and the surface temperature of this part became high.

When the surface temperature of the illumination optical system 5 becomes high, the temperature of the vicinity of the illumination optical system 5 increases, and air fluctuation is generated by this heat. Because of this air fluctuation, in the reticle alignment detection system 10, which is located near the illumination optical system 5, there was a problem in which accuracy became poor in the case of detecting the reference mark FM and the reticle mark RM.

SUMMARY OF THE INVENTION

One aspect of this invention is to provide an exposure device that does not negatively affect the detection accuracy of the reticle alignment detection system even when the surface temperature of the illumination optical system becomes high.

In order to achieve the above and other aspects, an exposure device of one embodiment of this invention includes an illumination optical system that irradiates an illumination light onto a mask. A device that exposes a substrate with the illumination light through the mask includes a gas supply device that supplies cleaned gas into a case that supports at least part of the illumination optical system. A temperature adjusting device adjusts the temperature of the case and the vicinity of the case.

Therefore, in the exposure device of this embodiment of the invention, at least part of the illumination optical system (preferably excluding the light source) is located within a case, and the gas supply device supplies cleaned gas, for example, inert gas for a photochemical reaction such as $N_2$. When the surface temperature of the case becomes high, it is possible to prevent the surrounding temperature of the illumination optical system from increasing due to the temperature adjusting device, which adjusts the temperature of the case and/or the surrounding environment.

BRIEF DESCRIPTION OF THE DRAWINGS

The invention will be described in conjunction with the following drawings in which like reference numerals designate like elements and wherein.

DETAILED DESCRIPTION OF PREFERRED EMBODIMENTS

Figure 1:
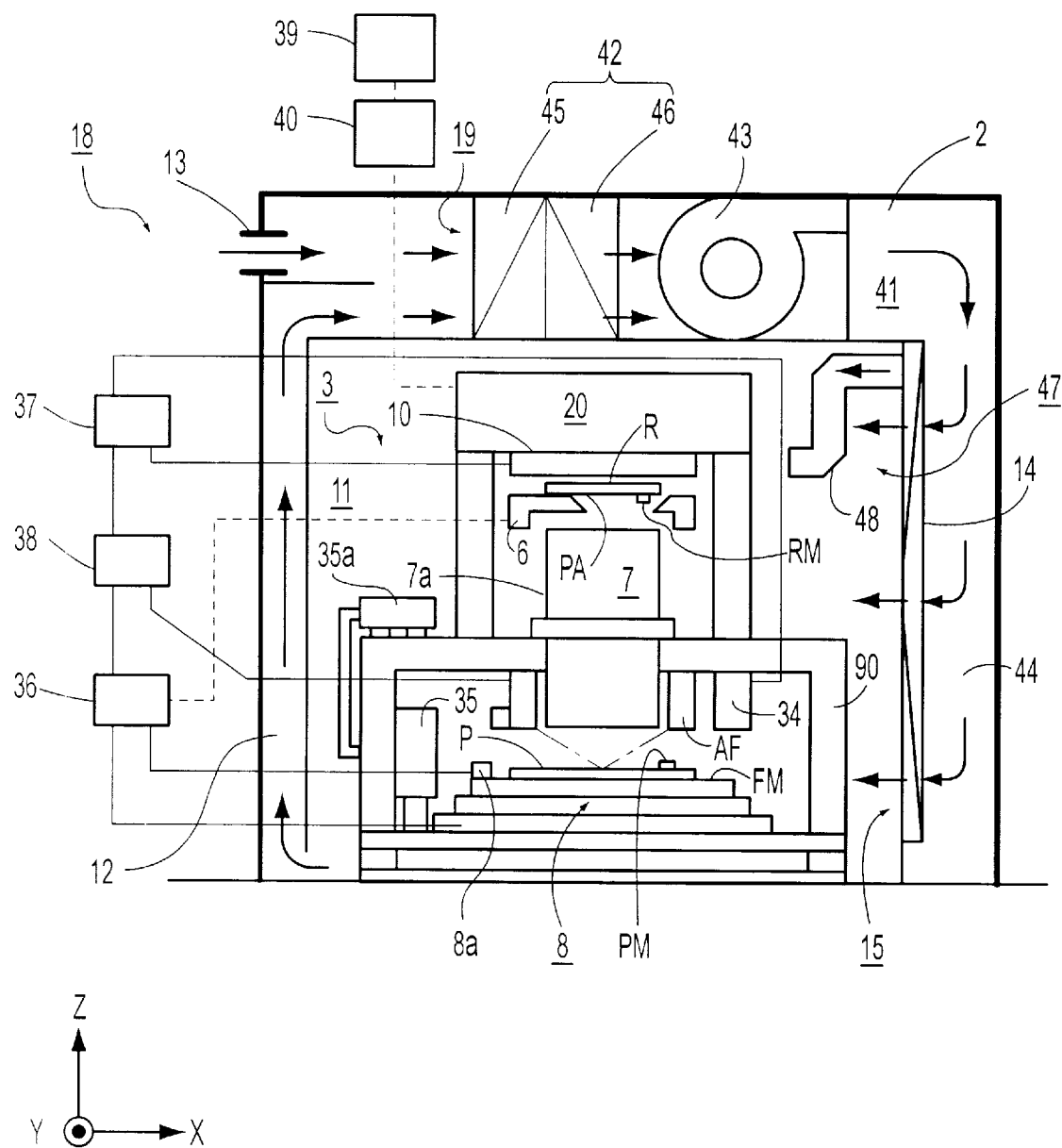
FIG. 1 is a schematic structural diagram of an exposure device having a temperature adjusting device and an $N_2$ supply device according to a first embodiment of the invention.
Figure 2:
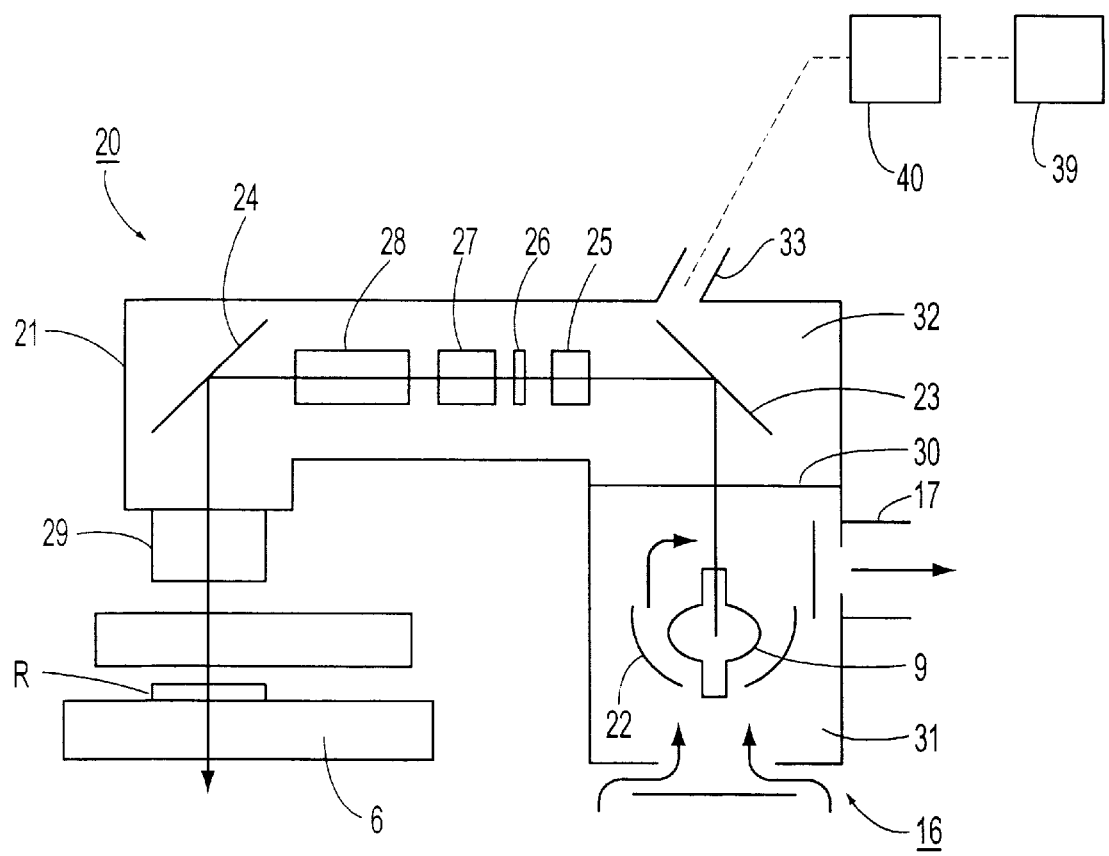
FIG. 2 is a schematic structural diagram of the illumination optical system, at least part of which is disposed within a case.
Figure 5:
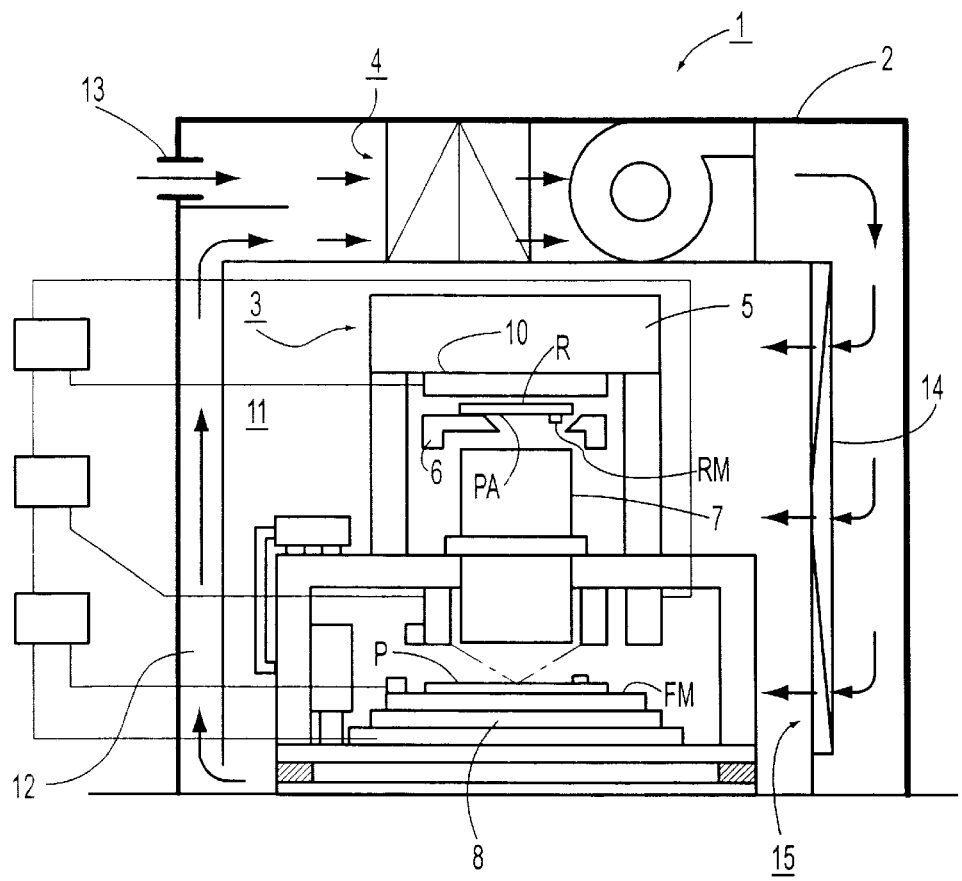
FIG. 5 is a schematic structural diagram showing one example of an exposure device having a conventional air filtering device.
Figure 6:
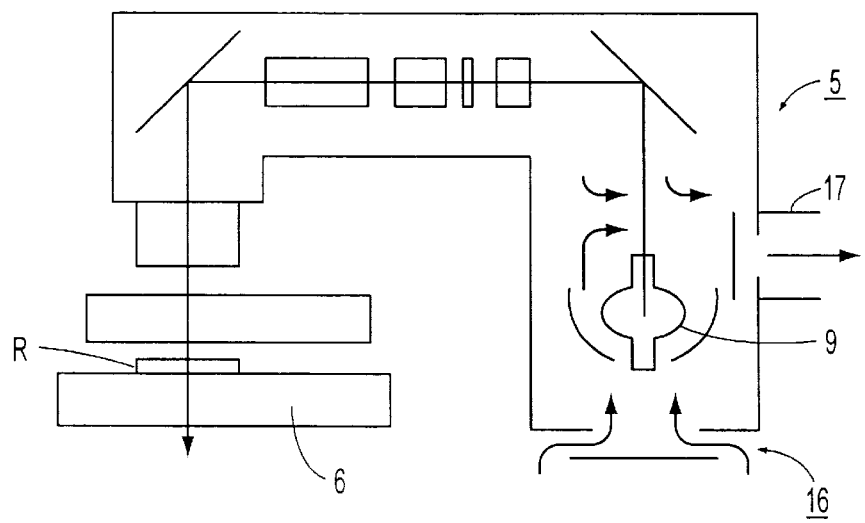
FIG. 6 is a schematic structural diagram of an illumination optical system that includes a conventional exposure device disposed within a case.

The following explains a first embodiment of an exposure device of this invention with reference to FIGS. 1 and 2. The exposure device is explained by using an example of a projection exposure device. In these figures, the same structural elements as in FIGS. 5 and 6 for a conventional example are identified with the same symbols, so their explanation is abbreviated.

FIG. 1 is a schematic structural diagram of an exposure device 18. The exposure device 18 is provided with a stage controlling system 36, an alignment controlling system 37, and a main controlling system 38 in addition to an exposure device main body 3 and an air circulating device (including a temperature controlling device) 19, all of which are located within a chamber 2. The exposure device main body 3 is mainly structured by an illumination optical system 20, a reticle stage 6 that holds a reticle R, a projection optical system 7, and a substrate stage 8 that holds a substrate P, all of which are stored in the temperature adjusting chamber (predetermined space) 11 within the chamber 2.

As shown in FIG. 2, the illumination optical system 20 illuminates a pattern PA formed in the reticle R with the illumination light that is generated from the light source 9. The illumination optical system 20 is schematically structured by a case 21, a light source 9 that is disposed within the case 21, an elliptic mirror 22, bending mirrors 23 and 24, an input lens 25, an interference filter 26, a fly eye integrator 27, a relay lens 28, a reticle blind (not depicted), and a condenser lens 29, which is disposed on the front of the case 21. The light source 9, the bending mirror 23, the input lens 25, the interference filter 26, the fly eye integrator 27, the relay lens 28, the reticle blind, the bending mirror 24, and the condenser lens 29 are arranged in sequence along the optical path to illuminate light onto the reticle R.

The elliptic mirror 22 condenses the light beam emitted by the light source 9. The bending mirrors 23 and 24 reflect the incident light beam. The input lens 25 makes the light beam reflected by the bending mirror 23 a substantially parallel light beam (i.e., the input lens functions as a collimating lens). Only the wavelength (g-line or i-line) that is needed for exposure among the incident light beams passes through the interference filter 26.

The fly eye integrator 27 makes the illumination distribution of the light beam that passed through the interference filter 26 uniform. The relay lens 28 makes the light beam, in which the illumination distribution in the fly eye integrator 27 was made to be uniform, a substantially parallel light beam. The reticle blind sets an illumination area for the reticle R. The condenser lens 29 image-forms an image of the illumination area that has been set in the reticle blind onto the reticle R.

The case 21 is separated into a light source chamber 31 and an $N_2$ purge chamber 32 by a wall 30, which includes a glass cover. The glass cover is made of a quartz compound and its size is determined to cover the area through which the illumination light passes. The light source chamber 31 contains the light source 9 and the elliptic mirror 22. Additionally, in this light source chamber 31, an air intake 16 and an heat emission duct 17 are arranged. By emitting air that was taken in from the air intake 16 through the heat emission duct 17, the heat generated by the light source 9 is emitted.

The $N_2$ purge chamber 32 contains the bending mirrors 23 and 24, the input lens 25, the interference filter 26, the fly eye lens (optical integrator) 27, the relay lens 28, and the reticle blind. An $N_2$ inlet 33 is provided in the $N_2$ purge chamber 32, through which $N_2$ gas is introduced to fill the $N_2$ purge chamber 32 with $N_2$ gas.

An $N_2$ supply device (gas supply device) 39 is connected to the $N_2$ inlet 33. The $N_2$ supply device 39 supplies $N_2$ gas cleaned by a filter or the like to the $N_2$ purge chamber 32 through the $N_2$ inlet 33. An $N_2$ temperature adjuster (gas temperature adjuster) 40 is attached to the $N_2$ supply device 39. The $N_2$ temperature adjuster 40 adjusts the temperature of the $N_2$ gas that is supplied into the $N_2$ purge chamber 32 by the $N_2$ supply device 39.

The reticle stage 6 holds a reticle R that can be two-dimensionally moved within an X-Y plane. Furthermore, the stage controlling system 36 is connected to the reticle stage 6.

The projection optical system 7 projects an image of a pattern PA of the reticle R illuminated with illumination light onto the substrate P that is held on the substrate stage 8. A lens barrel 7a of the projection optical system 7 is fixed to a first table 90 within the exposure device main body 3. Inside of the first table 90, a plate alignment detection system 34 is fixed. The plate alignment detection system 34 detects a reference mark PM formed on the substrate P and a reference mark FM disposed on the substrate stage 8.

The substrate stage 8 is two-dimensionally moved in an X-Y plane and also can be moved in a Z direction. Furthermore, the coordinates of the X-Y plane of the substrate stage 8 are measured by a laser interferometer 35 that irradiates a laser beam generated from a laser source 35a onto a moving mirror 8a disposed on the substrate stage 8.

The stage controlling system 36 also is connected to the substrate stage 8. The laser interferometer 35 is connected to the stage controlling system 36. The stage controlling system 36 moves the reticle stage 6 in the X-Y plane to arrange the reticle stage 6 in a predetermined position. Based upon the result measured by the laser interferometer 35, the stage controlling system 36 moves the substrate stage 8 in the X-Y plane to arrange the substrate stage 8 in a predetermined position. Furthermore, the stage controlling system 36 moves the substrate stage 8 in the Z direction and controls the substrate stage 8 so as to focus a pattern image of the reticle R onto the substrate P through the projection optical system 7.

A focus detection system AF is arranged in the upper direction of the substrate stage 8 and the side direction of the projection optical system 7. The focus detection system AF detects information concerning an image-forming state when a pattern PA formed in the reticle R is projected onto the substrate P. Furthermore, the detection result of the focus detection system AF is output to the main controlling system 38.

The reticle alignment detection system 10 is disposed between the upper direction of the reticle stage 6 and the illumination optical system 20. The reticle alignment detection system 10 detects a reference mark FM disposed on the substrate stage 8 through the projection optical system 7 and an alignment reticle mark RM formed on the reticle R. Additionally, the alignment controlling system 37 is connected to the reticle alignment detection system 10 and the plate alignment detection system 34.

Based upon the detection results of the reticle alignment detection system 10 and the plate alignment detection system 34, the alignment controlling system 37 performs alignment between the projection optical system 7 and the substrate stage 8.

The main controlling system 38 controls the stage controlling system 36 and the alignment controlling system 37 based upon the detection result of the focus detection system AF.

The air circulating device 19 controls the temperature within the temperature adjusting chamber 11 and is mainly structured by a temperature controlling device 42 and an air blower disposed in a flow path 41.

The flow path 41 is provided with a return duct 12 and a jet duct 44. Temperature-controlled gas is guided into the temperature adjusting chamber 11 through jets 15 in the partition wall 14 from the jet duct 44, goes through the return duct 12 from the temperature adjusting chamber 11, and reaches the jet duct 44 again so as to be circulated. The air that is taken in from the return duct 12 is mixed with air that is taken in from an external air intake 13. Furthermore, although not depicted, in the vicinity of the external air intake 13, an HEPA (High Efficiency Particulate Air) filter and a chemical filter are disposed to remove dust, organic substances, ammonium ions, sulfate ions, and the like from air that enters from the clean room.

The temperature controlling device 42 controls the temperature of the air that was taken in through the return duct 12 and the external air intake 13 and is provided with a heater 45 and a cooler 46. The air blower 43 adds pressure to the temperature-controlled air in the temperature controlling device 42 and sends the air to the jet duct 44.

A temperature adjusting device 47 is attached to the air circulating device 19. The temperature adjusting device 47 adjusts the temperature in the vicinity of the case 21 by sending the temperature-adjusted air thereto and is provided with: (1) an inlet duct (first inlet path) 48, (2) the temperature controlling device 42 that controls the temperature of the air, and (3) the air blower 43 that sends the temperature-controlled air. This embodiment provides a structure using both the temperature controlling device 42 and the air blower 43 of the air circulating device 19 to convey air through the inlet duct 48.

The inlet duct 48 is fixed to the partition wall 14 such that one of its open ends faces the jets in wall 14. The other open end of the inlet duct 48 is disposed so that air is guided between the illumination optical system 20 and the adjacent reticle alignment detection system 10.

The following explains the operation of the exposure device of the above embodiment. First, within the temperature adjusting chamber 11 of the chamber 2, the air that is temperature-controlled by the temperature controlling device 42 of the air circulating device 19 is sent from the jet duct 44 by the air blower 43 in a laminar flow state via the jets 15. At this time, dust, ions, and the like are removed from the air by a filter, so that the air is sent into the temperature adjusting chamber 11 in a chemically clean state.

The air circulating device 19 takes in air within the temperature adjusting chamber 11 from the return duct 12 and takes in air from the external air intake 13, and passes this air through the temperature controlling device 42 and the air blower 43 again. Thus, air is circulated within the temperature adjusting chamber 11 in the flow path 41 and the temperature controlling and dust removal are repeated, so that constant temperature and cleanliness can be maintained.

Meanwhile, part of the air sent from the jets 15 is directly guided between the illumination optical system 20 and the reticle alignment detection system 10 by the inlet duct 48 of the temperature adjusting device 47 to adjust the temperature of the case 21 and the temperature of the environment surrounding the case 21.

Furthermore, as shown in FIG. 2, in the light source chamber 31 of the case 21, the heat generated from the light source 9 is emitted as the air that was taken in from the air intake 16 is emitted from the heat emission duct 17. Furthermore, after the $N_2$ gas supplied from the $N_2$ supply device 39 is temperature-adjusted in the $N_2$ temperature adjuster 40, the gas is guided from the $N_2$ inlet 33 and is filled into the $N_2$ purge chamber 32.

Next, the main controlling system 38 sends an instruction to the stage controlling system 36 and the alignment controlling system 37 and performs alignment between the projection optical system 7 and the substrate stage 8. That is, based upon the instruction of the alignment controlling system 37, the reticle alignment detection system 10 detects the reference mark FM on the substrate stage 8 and the reticle mark RM on the reticle R through the projection optical system 7. At this time, based upon the result measured by the laser interferometer 35, the stage controlling system 36 moves the substrate stage 8 and the reticle stage 6 in the X-Y plane to the position in which the reticle alignment detection system 10 can detect the reference mark FM and the reticle mark RM. The coordinate position of the substrate stage 8 when the reticle alignment detection system 10 detects the reference mark FM and the reticle mark RM is measured by the laser interferometer 35.

Next, the plate alignment detection system 34 detects the reference mark FM on the substrate stage 8. At this time, the coordinate position of the substrate stage 8 is measured by the laser interferometer 35 in the same manner as above. Furthermore, after calculating the shift of the coordinates of the measurement results, by moving the reticle stage 6 based upon the calculation result, the positioning of the substrate stage 8 and the reticle R through the projection optical system 7 is performed.

Next, in the exposure process, after the light beam emitted from the light source 9 is condensed by the elliptic mirror 22, the light beam passes through the cover glass in wall 30, is incident to the bending mirror 23, and is reflected. After the reflected light beam is made to be substantially parallel by the input lens 25, the light beam is incident to the interference filter 26, and only the wavelength that is needed for exposure is transmitted. With respect to the light beam that transmits through the interference filter 26, after the illumination distribution is made to be uniform by the fly eye integrator 27, the light beam is again made to be substantially parallel by the relay lens 28. Furthermore, the light beam having the illumination area for the reticle R is set by the reticle blind and then illuminates the reticle R as an illumination light by passing through the condenser lens 29.

An image of the pattern PA of the reticle R that was illuminated by the illumination light is projected onto the substrate P and exposed. Additionally, the image-forming state of the pattern PA on the substrate P is detected by the focus detection system AF. If the image-forming state is not in a predetermined state, the main controlling system 38 sends an instruction to the stage controlling system 36, moves the substrate stage 8 in the Z direction, and focuses the image of the pattern PA on the substrate P.

In the exposure device of this embodiment, the temperature within the temperature adjusting chamber 11 can be constantly maintained by the air circulating device 19. At the same time, even if the temperature of the $N_2$ purge chamber 32 becomes high and the surface temperature of the case 21 becomes high, the inlet duct 48 of the temperature adjusting device 47 guides part of the clean, temperature-controlled air that is sent from the jets 15 directly between the illumination optical system 20 and the reticle alignment detection system 10. Thus, a predetermined temperature can be maintained between systems 10 and 20. Therefore, in the exposure device of this embodiment, generation of air fluctuation by a temperature increase in the vicinity of the illumination optical system 20 can be prevented, so it is possible to prevent the detection accuracy of the reticle alignment detection system 10 from deteriorating.

Furthermore, in the exposure device of this embodiment, because the $N_2$ temperature adjuster adjusts the temperature of $N_2$ gas supplied by the $N_2$ supply device 39, the temperature increase within the $N_2$ purge chamber 32 can be controlled, and the temperature adjustment that uses the inlet duct 48 can be further efficiently performed. Furthermore, in the exposure device of this embodiment, because the temperature adjustment device 47 uses the temperature controlling device 42 and the air blower 43 of the air circulating device 19, separate components are not needed and the device can be made relatively small.

Figure 3:
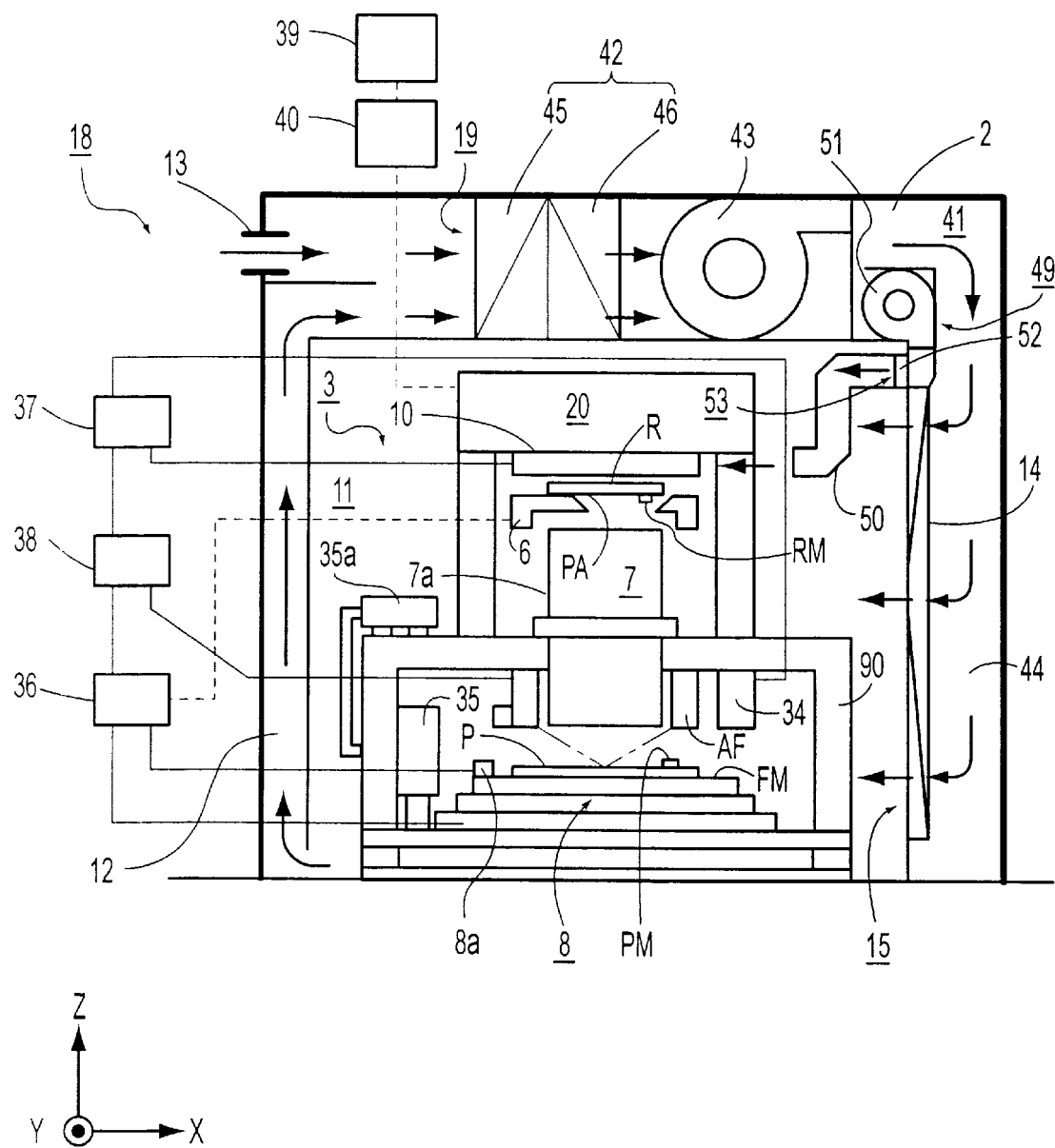
FIG. 3 is a schematic structural diagram of an exposure device having a temperature adjusting device that includes an independent air blower according to a second embodiment of the invention.

FIG. 3 is a diagram showing a second embodiment of an exposure device of the invention. In this diagram, the elements that are the same as the elements of the first embodiment shown in FIGS. 1 and 2 are identified by the same symbols, so a further explanation thereof is omitted.

A difference between the second embodiment and the first embodiment relates to the structure of the temperature adjusting device. That is, the temperature adjusting device 49 shown in FIG. 3 includes: (1) an inlet duct (second inlet path) 50, (2) the temperature controlling device 42 that controls the temperature of air, and (3) the air blower 51, which adds pressure to the temperature-controlled air and sends the temperature-controlled air only into duct 50. The temperature adjusting device 49 has its own independent air blower 51 and is used in conjunction with the temperature controlling device 42 of the air circulating device 19.

One open end of the inlet duct 50 is fixed to a partition wall 52, and other open end is disposed so that air can be guided between the vicinity of the case 21, particularly, the illumination optical system 20 and the adjacent reticle alignment detection system 10. The partition wall 52 is disposed adjacent to the partition wall 14 so as to be independent from the partition wall 14. Furthermore, jets 53 that jet air are formed in the partition wall 52.

Over the jets 53, a filter to remove dust in the air and a filter (not depicted) to remove organic substances, ions, and the like is disposed. The air blower 51 is structured to send part of the air output by the air blower 43 of the air circulating device 19 to the jets 53.

The other structure of the second embodiment is the same as in the first embodiment described above.

In the exposure device of this embodiment, in addition to obtaining the same operation and effects as in the first embodiment described above, the inlet duct 50 guides part of the temperature-controlled air from the jets 53, which define an entrance different from the jets 15 of the partition wall 14, to the vicinity of the case 21, so that the inlet duct 50 can prevent the disturbance of the flow of the air sent to the temperature adjusting chamber 11 in a laminar flow state from the jets 15. Therefore, when the flow of the air is disturbed, as the pressure in the vicinity of the inlet duct 50 decreases, it is possible to prevent micro-dust included in the air from staying in, for example, the upper part of the inlet duct 50, and cleanliness within the temperature adjusting chamber 11 can be maintained.

Furthermore, in the exposure device of this embodiment, because the temperature adjusting device 49 has an independent air blower 51, the flow amount of air that is guided through the inlet duct 50 can be independently adjusted. Because of this, the flow amount of air that is sent to the vicinity of the case 21 can be easily adjusted in response to circumstances such as the surface temperature of the case 21.

Figure 4:
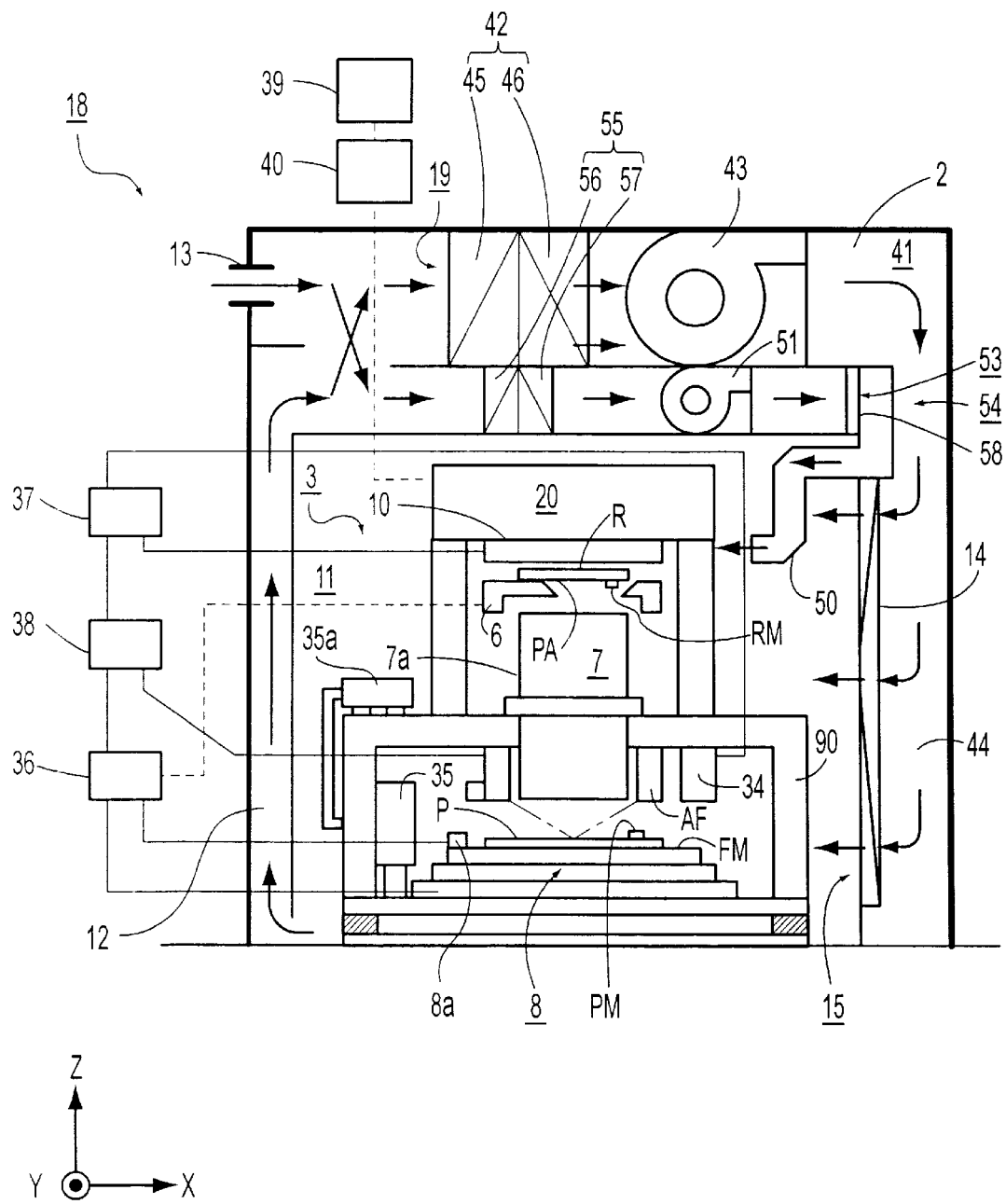
FIG. 4 is a schematic structural diagram of an exposure device having independent temperature adjusting devices and air blowers for the case and for the overall device according to a third embodiment of the invention.

FIG. 4 is a diagram showing a third embodiment of an exposure device of the invention. In this diagram, the same symbols are used for the elements therein that are the same as the elements of the second embodiment as shown in FIG. 3, so additional explanation is omitted.

The difference between the third and the second embodiments is the structure of the temperature adjusting device. That is, the temperature adjusting device 54 shown in FIG. 4 is provided with an inlet duct 50, a temperature controlling device 55 that controls the temperature of air, an air blower 51 that adds pressure to and sends the temperature-controlled air, and a temperature sensor (not depicted). Therefore, in the exposure device of this embodiment, the temperature adjusting device 54 and the air circulating device 19 have their own independent temperature controlling devices and air blowers, respectively, in a parallel state.

The temperature controlling device 55 controls the temperature of the air that was taken in and includes a heater 56 and a cooler 57. After the air that was guided through the return duct 12 and the external air intake 13 is mixed, that air is separately taken into the temperature adjusting device 54 and the air circulating device 19.

One open end of the inlet duct 50 is fixed to the partition wall 58, and the other open end is disposed so that air can be guided between the vicinity of the case 21, particularly, the illumination optical system 20 and the adjacent reticle alignment detection system 10. The partition wall 58 is disposed separately from the partition wall 14 so as to be independent from the partition wall 14.

Jets 53 to jet air and a temperature sensor are disposed in the partition wall 58. The temperature sensor detects the temperature of the air sent by the air blower 51. The temperature adjusting device 54 is structured so as to drive the temperature controlling device 55, that is, the heater 56 and the cooler 57, based upon the detection result of the temperature sensor.

In the exposure device of this embodiment, in addition to the same operation and effects as in the second embodiment, the temperature adjusting device 54 has its own independent temperature controlling device 55. Therefore, regardless of the temperature within the temperature adjusting chamber 11, the temperature of the air to be sent to the vicinity of the case 21 can be easily adjusted to a temperature that is different from the temperature in the temperature adjusting chamber 11 in response to circumstances such as the surface temperature of the case 21.

Additionally, in the exposure device of this embodiment, the temperature sensor detects the temperature of the air to be sent to the vicinity of the case 21 and the temperature controlling device 55 adjusts the temperature of the air based upon the detected temperature. Thus, it is possible to adjust the temperature to a temperature that is set in advance by monitoring the temperature of the air.

In the above-mentioned embodiment, the inlet ducts 48 and 50 are structured so that air can be guided between the illumination optical system 20 and the adjacent reticle alignment detection system 10. The invention is not limited to this structure, and it is also acceptable to have a structure in which temperature-adjusted air is guided to the vicinity of the plate alignment detection system 34, the vicinity of other optical systems that detect a reticle mark RM on the reticle R, and the vicinity of the projection optical system 7, or a structure in which a plurality of inlet ducts are disposed and each inlet duct sends the temperature-adjusted air to the vicinity of the plurality of other optical systems and to the vicinity of the projection optical system 7, respectively. Furthermore, in the same manner as in the illumination optical system 20, the projection optical system 7 can be sealed in a case and $N_2$ purged.

Furthermore, if a flow path of liquid is disposed so as to cover the case 21, for example, the case 21 has a double housing structure, the liquid can be supplied therebetween, and the case 21 can be directly cooled (by temperature control). The coolant can be gas or liquid. For example, Fluorinate or the like can be used for the liquid.

Furthermore, in the above-mentioned embodiment, the temperature adjusting device that adjusts the temperature of the vicinity of the case 21 sends temperature-adjusted air from the inlet duct, but the invention is not limited to this structure. For example, by adjusting the temperature of $N_2$ gas supplied into the case 21 by the $N_2$ supply device 39 and the $N_2$ temperature adjuster 40, the surface temperature of the case 21 can be adjusted. In this case, the structure cannot provide a large temperature difference from the temperature adjusting chamber 11, so the adjustable temperature width should be limited to be small, and this should be preferably used as a supplement.

Furthermore, the gas supplied into the case 21 is $N_2$ gas, but, for example, inert gas for the photochemical reaction including helium or the like and chemically clean dry air (e.g., dry air with humidity approximately less than 5%) in which organic substances, ions, and the like have been removed can be used. Additionally, a pressure adjusting mechanism can be provided with the $N_2$ supply device 40 so that the pressure within the case 21 can be constant. By setting this pressure adjusting mechanism, changes in the image-forming characteristics of the illumination optical system 20 by the pressure change within the case 21 can be prevented.

Part of the optical elements that form the illumination optical system 20 are stored within the case 21, but the invention is not limited to this structure. All of the optical elements that form the illumination optical system 20 can be stored within the case 21. Furthermore, part of the optical elements that form the illumination optical system 20 can also be disposed outside of the chamber 2. For example, the light source 9 can be disposed separately from the illumination optical system 20.

A glass substrate for a liquid crystal display element, a semiconductor wafer for a semiconductor device, a ceramic wafer for a thin film magnetic head, or a mask that is used by an exposure device, a reticle substrate (quartz compound, silicon wafer) or the like can be used as the substrate P.

The exposure device can be a step-and-repeat type projection exposure device (stepper) that exposes a pattern PA of a reticle R in a state in which the reticle R and the substrate P are still, and then moves the substrate P in a sequential step, or a step-and-scan type scanning exposure device (scanning stepper) that exposes a pattern PA of a reticle R by synchronously moving the reticle R and the substrate P during image pattern exposure.

As disclosed in U.S. Pat. No. 5,715,037, with respect to a scanning exposure device, a reticle can be illuminated by a plurality of illumination optical systems, and a pattern image of a reticle can be projected onto a substrate by using a plurality of projection optical systems. Thus, when a plurality of illumination systems are used, each illumination optical system can have its own independent case 21 which is $N_2$ purged. Additionally, the temperature-adjusted gas can be sent to each case 21. The disclosure of U.S. Pat. No. 5,715,037 is incorporated herein by reference in its entirety.

The invention also can be applied to a mirror projection type unity magnification exposure device (aligner) that does not use a projection optical system 7, and to a proximity type or contact type exposure device or the like.

The invention can be used with a wide variety of exposure devices for semiconductor fabrication, and with liquid crystal exposure devices that expose a liquid crystal display element pattern onto a rectangular-shaped glass substrate, and to an exposure device that fabricates a thin film magnetic head, an imaging element (CCD), or a reticle.

Furthermore, a luminescent beam generated from a super high pressure mercury lamp (g-line (436 nm), i-line (365 nm)), a KrF excimer laser (248 nm), an ArF excimer laser (193 nm), an $F_2$ laser (157 nm), or the like can be used for the light source 9 of the illumination optical system 20. Furthermore, high frequency such as a YAG laser and a semiconductor laser can also be used. Additionally, when an $F_2$ laser is used as a light source 9, the gas that is supplied to the case 21 preferably is helium.

The magnification of the projection optical system 7 can be such that the system 7 is a reduction system, a unity magnification system, or an enlargement system.

Furthermore, if deep-ultraviolet radiation, such as an excimer laser, is used for the projection optical system 7, a material can be used that transmits deep-ultraviolet radiation, e.g., a glass material such as quartz and quartzite. In the case of using an $F_2$ laser, a reflection and refracting (catadioptric) system or a pure refracting system can be used.

If a linear motor is used for driving the substrate stage 8 or the reticle stage 6, an air floating type using an air bearing or a magnetic floating type using Lorentz's force or a reaction force can be used. Additionally, a type of motor that moves along a guide can be used for each stage 6 and 8 or a guideless type that does not use a guide can be used.

A reaction force that is generated by movement of the substrate stage 8 can be mechanically transferred to the floor (ground) by using a frame member. A reaction force that is generated by movement of the reticle stage 6 can be mechanically transferred to the floor (ground) by using a frame member.

Optical adjustment is performed as the illumination optical system 20, which is structured by a plurality of optical elements, and the projection optical system 7 are incorporated into the exposure device main body 3, respectively. Wires and conduits, etc., are connected as the reticle stage 6, which is structured by many mechanical parts, and the substrate stage 8 are fixed to the exposure device main body 3, and the overall adjustment (electrical adjustment, operation confirmation, and the like) is performed. Therefore, the exposure device of this embodiment can be manufactured, preferably in a clean room in which humidity, cleanliness, and the like are managed.

A device such as a liquid crystal display element and a semiconductor device are manufactured by performing function/performance capability design of each device, manufacturing a reticle based upon this design, manufacturing a glass substrate and a wafer, exposing a pattern of the reticle onto the glass substrate or the wafer by an exposure device in the above-mentioned embodiment, incorporating each device, testing, or the like.

As explained above, the exposure device according to one aspect of the invention supplies gas into a case in which is arranged at least part of an illumination optical system, and a temperature adjusting device adjusts the temperature of the case or the temperature in the vicinity of the case. Thus, the exposure device can adjust and maintain the temperature of the case in which the illumination optical system is disposed and the temperature in the vicinity of the case. Because of this, an effect can be obtained in which it is possible to prevent the decrease of illumination of the illumination optical system and to generate the air fluctuation in the vicinity of the illumination optical system.

According to another aspect, the temperature adjusting device sends the temperature-controlled gas to the vicinity of the case. Thus, in this exposure device, the temperature of the case in which the illumination optical system is disposed and the temperature in the vicinity of the case can be adjusted and maintained. Because of this, an effect can be gained in which generation of air fluctuation in the vicinity of the illumination optical system can be prevented.

According to another aspect, the temperature adjusting device sends the temperature-controlled gas between the illumination optical system and an adjacent device. Thus, in this exposure device, the temperature between the illumination optical system and the adjacent device can be adjusted and maintained. An effect can be gained in which generation of air fluctuation in the vicinity of the illumination optical system can be prevented.

According to another aspect, at least part of the optical system that detects a mark on a mask is located adjacent to an illumination optical system and is the adjacent device. Thus, in this exposure device, generation of air fluctuation in the vicinity of the optical system that detects a mark can be prevented, so that an excellent effect can be gained in which it is possible to prevent detection accuracy by air fluctuation from deteriorating.

According to another aspect, the air temperature adjuster adjusts the temperature of the gas that is supplied into the case. Thus, in this exposure device, because the temperature of the case can be adjusted through the gas, an effect can be gained in which the temperature adjustment by the temperature adjuster can be further efficiently performed. At the same time, by adjusting the temperature of the vicinity of the case and the surface temperature of the case by using gas that is supplied to the case, an effect can be gained in which generation of air fluctuation can be prevented.

According to another aspect, the exposure device includes a chamber that stores a device main body and a temperature controlling device that controls the temperature of a predetermined space within the chamber. Thus, in this exposure device, when the temperature is controlled in a predetermined space within the chamber, because the temperature adjusting device can further adjust and maintain the temperature of the case and the temperature in the vicinity of the case, an effect can be gained in which the generation of air fluctuation in the vicinity of the illumination optical system can be further efficiently prevented.

According to another aspect, the temperature adjusting device has a first inlet path that guides part of the temperature-controlled gas to the vicinity of the case. Thus, in this exposure device, it is not necessary to provide a dedicated temperature controlling device and/or an air blower specifically for the temperature adjusting device, so that an excellent effect can be gained in which a device can be made to be smaller and the cost can be decreased.

According to another aspect, the temperature adjusting device has a second inlet path that guides part of the temperature-controlled gas to the vicinity of the case, and the second inlet path has an entrance different from an inlet that guides the temperature-controlled gas to the predetermined space. Thus, in this exposure device, it is possible to prevent the second inlet path from disturbing the flow of the gas that is guided into the predetermined space in a laminar flow state from an inlet. Therefore, accumulating micro-dust included in the gas by disturbing the flow of the gas can be prevented, and an effect can be gained in which the cleanliness within the predetermined space can be maintained.

According to another aspect, independent air blowers and temperature controlling devices can be provided for the temperature controlling device of the exposure device and the temperature adjusting device for the case, respectively. Thus, in this exposure device, an excellent effect can be gained in which the flow amount of gas that is sent to the vicinity of the case and the temperature that is different from the inside of a predetermined space can be easily adjusted in response to circumstances.

According to another aspect, a projection optical system that projects an illumination light onto a substrate is arranged in the predetermined space. Thus, in this exposure device, an effect can be gained in which generation of air fluctuation in the vicinity of the illumination optical system can be efficiently prevented in the projection exposure device.

While the present invention has been described with reference to preferred embodiments thereof, it is to be understood that the invention is not limited to the disclosed embodiments or constructions. To the contrary, the invention is intended to cover various modifications and equivalent arrangements. In addition, while the various elements of the disclosed invention are shown in various combinations and configurations, that are exemplary, other combinations and configurations, including more, less or only a single element, are also within the spirit and scope of the invention.

What is claimed is:

1. An exposure device comprising:
   an illumination optical system that irradiates an illumination light onto a mask to expose a substrate with the illumination light through the mask;

a case that surrounds at least part of the illumination optical system;

a first gas supply device that supplies a first gas into the case;

a second gas supply device that supplies a second gas that is different from the first gas to a vicinity of the case; and a temperature adjusting device that adjusts a temperature of the first gas and a temperature of the second gas.

2. The exposure device of claim 1, wherein the temperature adjusting device sends temperature-controlled air to the vicinity of the case.

3. The exposure device of claim 2, wherein the temperature adjusting device sends temperature-controlled air between the case and an adjacent device in the exposure device.

4. The exposure device of claim 3, wherein the adjacent device includes at least part of an optical system that detects a mark on the mask.

5. The exposure device of claim 1, further comprising:

a chamber that contains a device main body of the exposure device, which includes at least part of the illumination optical system; and a temperature controlling device that controls the temperature of a predetermined space within the chamber.

6. The exposure device of claim 5, wherein:

the temperature controlling device sends temperature-controlled gas to the predetermined space; and the temperature adjusting device includes a first inlet path that guides part of the temperature-controlled gas sent by the temperature controlling device to the vicinity of the case.

7. The exposure device of claim 6, wherein:

the temperature controlling device includes an air blower and a temperature controlling unit; and the temperature adjusting device also uses at least one of the air blower and the temperature controlling unit.

8. The exposure device of claim 6, wherein:

the temperature controlling device sends temperature-controlled gas to the predetermined space; and the temperature adjusting device includes a second inlet path that guides part of the temperature-controlled gas sent by the temperature controlling device to the vicinity of the case from an entrance that is different from an inlet that guides the temperature-controlled gas to the predetermined space.

9. The exposure device of claim 8, wherein:

the temperature controlling device includes an air blower and a temperature controlling unit; and the temperature adjusting device also uses at least one of the air blower and the temperature controlling unit.

10. The exposure device of claim 9, wherein the temperature controlling device and the temperature adjusting device each include their own independent air blower and the temperature controlling unit.

11. The exposure device of claim 6, further comprising:

a projection optical system that projects the illumination light onto the substrate, and the projection optical system being disposed in the predetermined space.

12. An object on which a pattern has been exposed utilizing the exposure device of claim 1.

13. A method of making an exposure device comprising the steps of:

providing an illumination optical system that irradiates an illumination light onto a mask to expose a substrate with the illumination light through the mask;

providing a case that surrounds at least part of the illumination optical system;

providing a first gas supply device that supplies a first gas into the case;

providing a second gas supply system that supplies a second gas that is different from the first gas to a vicinity of the case; and providing a temperature adjusting device that adjusts a temperature of the first gas and a temperature of the second gas.

14. The method of claim 13, wherein the temperature adjusting device sends temperature-controlled air to the vicinity of the case.

15. The method of claim 14, wherein the temperature adjusting device sends temperature-controlled air between the case and an adjacent device in the exposure device.

16. The method of claim 15, wherein the adjacent device includes at least part of an optical system that detects a mark on the mask.

17. The method of claim 13, further comprising:

providing a chamber that contains a device main body of the exposure device, which includes at least part of the illumination optical system; and providing a temperature controlling device that controls the temperature of a predetermined space within the chamber.

18. The method of claim 17, wherein:

the temperature controlling device sends temperature-controlled gas to the predetermined space; and the temperature adjusting device includes a first inlet path that guides part of the temperature-controlled gas sent by the temperature controlling device to the vicinity of the case.

19. The method of claim 18, wherein:

the temperature controlling device includes an air blower and a temperature controlling unit; and the temperature adjusting device also uses at least one of the air blower and the temperature controlling unit.

20. The method of claim 17, wherein:

the temperature controlling device sends temperature-controlled gas to the predetermined space; and the temperature adjusting device includes a second inlet path that guides part of the temperature-controlled gas sent by the temperature controlling device to the vicinity of the case from an entrance that is different from an inlet that guides the temperature-controlled gas to the predetermined space.

21. The method of claim 20, wherein:

the temperature controlling device includes an air blower and a temperature controlling unit; and the temperature adjusting device also uses at least one of the air blower and the temperature controlling unit.

22. The method of claim 20, wherein the temperature controlling device and the temperature adjusting device each include their own independent air blower and the temperature controlling unit.

23. The method of claim 17, further comprising:

providing a projection optical system that projects the illumination light onto the substrate, the projection optical system being disposed in the predetermined space.

24. An exposure method for forming a pattern of a mask onto a substrate, the method comprising the steps of:

irradiating an illumination light onto a mask to expose a substrate with the illumination light through the mask, the illumination light irradiated from an illumination optical system, at least part of which is surrounded by a case;

supplying a first gas that is temperature-controlled into the case; and supplying a second gas that is temperature-controlled to an optical member that is different from the illumination optical system, the second gas being different from the first gas.

25. The method of claim 24, wherein a temperature of the case is adjusted by the second gas.

26. The method of claim 24, wherein the optical member is at least part of an optical system that detects a mark on the mask.

27. The method of claim 24, further comprising:

controlling the temperature of a predetermined space within a chamber that contains a device main body of an exposure device in which at least part of the illumination optical system is located.

28. The method of claim 27, wherein:

the temperature of the predetermined space is controlled by sending temperature-controlled gas to the predetermined space; and the temperature of the case and of the vicinity of the case are adjusted by conducting part of the temperature-controlled gas sent toward the predetermined space through a first inlet path to the vicinity of the case.

29. The method of claim 28, wherein:

the temperature controlled gas is sent to the predetermined space by an air blower and a temperature controlling unit; and at least one of the air blower and the temperature controlling unit also conveys the temperature controlled gas to the vicinity of the case.

30. The method of claim 27, wherein:

the temperature of the predetermined space is controlled by sending temperature-controlled gas to the predetermined space; and the temperature of the case and of the vicinity of the case are adjusted by conducting part of the temperature-controlled gas sent toward the predetermined space through a second inlet path that guides part of the temperature-controlled gas to the vicinity of the case from an entrance that is different from an inlet that guides the temperature-controlled gas to the predetermined space.

31. The method of claim 30, wherein:

the temperature controlled gas is sent to the predetermined space by an air blower and a temperature controlling unit; and at least one of the air blower and the temperature controlling unit also conveys the temperature controlled gas to the vicinity of the case.

32. The method of claim 30, an independent air blower and an temperature controlling unit are provided to supply the temperature-controlled gas to the predetermined space and the vicinity of the case, respectively.

33. The method of claim 27, wherein a projection optical system that projects the illumination light onto the substrate is disposed in the predetermined space.

34. The exposure device of claim 1, wherein the first gas is a clean gas.

35. The method of claim 13, wherein the first gas is a clean gas.

36. The method of claim 24, wherein the first gas is a clean gas.

37. An exposure device comprising:

an illumination optical system that irradiates an illumination light onto a mask to expose a substrate with the illumination light through the mask;

a first gas supply device that supplies a first gas that is temperature-controlled to at least part of the illumination optical system;

an optical member that is different from the illumination optical system; and a second gas supply device that supplies a second gas that is temperature-controlled to the optical member, the second gas being different from the first gas.

38. The exposure device of claim 37, wherein the first gas is one of nitrogen, helium and air.

39. The exposure device of claim 37, wherein the second gas is air.

40. The exposure device of claim 37, wherein the optical member is at least part of an optical system that detects a mark on the mask.

* * * * *